United States Patent [19]

Haas et al.

[11] 4,142,145
[45] Feb. 27, 1979

[54] METHOD FOR DETERMINING CONDUCTION-BAND EDGE AND ELECTRON AFFINITY IN SEMICONDUCTORS

[75] Inventors: George A. Haas, Alexandria, Va.; Arnold Shih, Gaithersburg; Richard E. Thomas, Riverdale, both of Md.

[73] Assignee: The United States of America as represented by the Secretary of the Navy, Washington, D.C.

[21] Appl. No.: 863,362

[22] Filed: Dec. 22, 1977

[51] Int. Cl.² ............................................. G01R 27/02
[52] U.S. Cl. ..................................... 324/62; 250/307; 324/158 R
[58] Field of Search .................. 324/62, 158 R, 158 T; 250/307; 29/574; 313/360, 361

[56] References Cited

U.S. PATENT DOCUMENTS

| 3,146,347 | 8/1964 | Ziegler | 250/307 |
| 3,337,729 | 8/1967 | Thomas et al. | 250/307 |
| 3,341,704 | 9/1967 | Thomas et al. | 250/307 |
| 3,745,454 | 7/1973 | Nikirk et al. | 324/62 X |
| 3,876,879 | 4/1975 | McAdans et al. | 250/307 |
| 3,935,458 | 1/1976 | Peters | 324/62 X |
| 4,000,458 | 12/1976 | Miller et al. | 324/62 X |

Primary Examiner—Stanley T. Krawczewicz
Attorney, Agent, or Firm—R. S. Sciascia; Philip Schneider; William C. Daubenspeck

[57] ABSTRACT

A method which utilizes low-energy electron reflections to determine the electron affinity and to simultaneously locate the position of the conduction-band edge with respect to the Fermi level at the surface of a single-crystal semiconductor. A beam of very-low-energy electrons (<10eV) is directed onto the surface of the semiconductor and the reflection pattern (beam energy v. current collected by the semiconductor) is analyzed using a kinematical approximation for the interference phenomena.

4 Claims, 7 Drawing Figures

METHOD FOR DETERMINING CONDUCTION-BAND EDGE AND ELECTRON AFFINITY IN SEMICONDUCTORS

BACKGROUND OF THE INVENTION

This invention relates to the measurements of surface properties in semiconductors and, more particularly, to a method to determine the electron affinity and to simultaneously locate the position of the conduction-band edge with respect to the Fermi level at the surface of single crystal-semiconductors.

In determining semiconductor surface properties, one of the most surface-sensitive techniques is the measurement of the surface work function $\phi$. However, this quantity is composed of two components; (a) the position of the conduction-band edge $E_c$ with respect to the Fermi level and (b) the electron affinity $\chi$. The former is governed by such band structure properties of the solid as the donor position, density, and ionization probability, while the latter is strongly dependent on characteristics such as surface dipole layers. Because of these differences, it would be desirable to separate the two components in the measurement of work function. This will not only determine the various properties simultaneously for a particular set of surface conditions, but will also quantitatively identify changes in work function as being caused by specific contributions from either or both of its components.

In the past, there has been no singularly direct and reliable method for experimentally determining these two components of the work function despite a great deal of interest in the area. For example, alkaline earth semiconductor compounds (such as barium oxide) have been widely used to provide low-work-function surfaces for electron emission applications and have been extensively studied for many years. However, there are still many basic but yet unanswered questions regarding which factors are actually responsible for the activity of these alkaline earth oxide emitters. Investigation of many of these questions would be aided if the work function could be separated into its components, which as previously noted are strongly influenced by specific surface properties.

Experimentally, electron affinity has been inferred from combining the results of separate procedures. For example, the electron affinity $\chi$ has been estimated from the temperature at which pore conductivity and crystal conductivity are roughly equal in oxide cathodes. It has also been derived by combining optical adsorption and photoconductivity measurements. These techniques, in addition to requiring separate experiments (using different apparatus so that the experiments cannot be accomplished simultaneously without great difficulty), also involve assumptions that give uncertainty to the estimated values, and are not generally applicable to all semiconductors. Conductivity, in general, may be measured by mechanical probes, but this leads to the problems which are normally associated with probe measurements. These are especially acute when it is desired to measure the conductivity for small surface areas in the region near the semiconductor surface.

SUMMARY OF THE INVENTION

The present invention is a method which uses low-energy-electron reflections (LEER) to determine the electron affinity and to simultaneously locate the position of the conduction-band edge with respect to the Fermi level at the surface of a single-crystal semiconductor. A small-cross-sectional-area beam of very-low-energy electrons (<10eV) is directed onto the area of the semiconductor surface (target) where it is desired to investigate the surface properties. The energy of the beam is varied through the retarding-to-accelerating region and the current collected by the semiconductor target is monitored. Minima in the collected current will correspond to electron reflections for unallowed-energy states in the conduction band of the semiconductor surface. Analysis of the current collected by the target versus the energy of the incident electrons using a kinematical approximation for electron interactions with a lattice determines the work function and its component parts, the electron affinity $\chi$ and the position of the conduction-band edge $E_c$, for the area of the semiconductor under investigation.

Among the advantages of the present invention is that the electron affinity $\chi$ and the position of the conduction band $E_c$ with respect to the Fermi level of a single-crystal semiconductor can be directly measured by a single technique. This will also quantitatively identify changes in the work function of a surface as being caused by specific contributions from either or both of its components. Small areas of the semiconductor surface may be investigated and the measurements are confined to the near-surfaces properties (i.e., five or six molecular layers). In addition, the surface to be investigated does not have to be heated nor are probe measurements required.

Other advantages of this invention will be readily appreciated as the same becomes better understood by reference to the following detailed description when considered in conjunction with the accompanying drawings wherein:

DESCRIPTION OF THE PREFERRED EMBODIMENT

Figure 1:
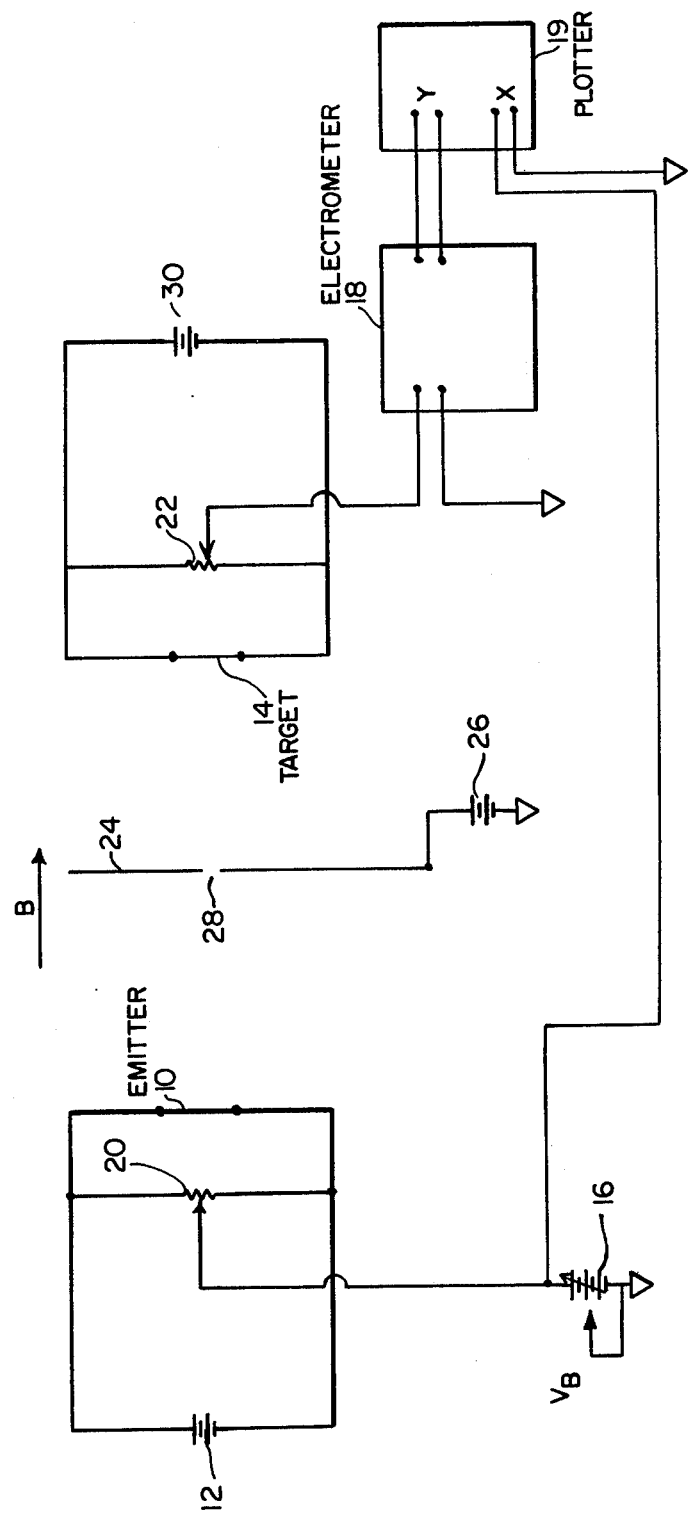
FIG. 1 is a schematic diagram of apparatus suitable for providing an electron beam for use in the present invention.

FIG. 1 shows a schematic diagram of apparatus which may be used to provide incident electrons having the appropriate energies for measuring the electronic surface characteristics of a single-crystal semiconductor in an experimental application of the present invention. The apparatus is a single plane-parallel retarding-potential assembly similar to that of Shelton (Physical Review 107 (1957) p. 1153). An electron emitter 10 is resistively heated by a filament voltage supply 12 to provide thermionic emission and the surface to be investigated acts as the collector 14 for the emitted electrons. A variable beam-voltage supply 16 establishes a beam energy or potential $V_B$, either positive or negative, between the emitter 10 and the collector 14 (i.e., the semiconductor target). The target 14 is maintained at approximately ground potential whereas the emitter is biased with respect to ground by the beam voltage supply 16. The current collected by the target 14 is monitored by an electrometer 18 and an X-Y platter is used to correlate the beam energy with the current collected.

The beam voltage $V_B$ is applied to the emitter 10 through variable resistance 20 which is connected in parallel with the emitter. This allows compensation for the emitter resistance so that the retarding potential may be applied with respect to a specific point (the point from which the electrons which form the beam are emitted) on the emitter. Similarly, the electrometer 18 is coupled to the collector 14 through variable resistance 22 to allow for measurement of the collector current with respect to a specific point (i.e., the area where the electrons are incident on the collector).

Collimation of the beam is accomplished through the use of an accelerating electrode 24 (positively biased by a voltage supply 26) which has a beam-defining aperture 28. The accelerating electrode 24 also provides an electric field in front of the target to reduce the interaction of localized fields with the beam. A strong magnetic field (provided by an external coil not shown) normal to the emitting and collecting surfaces minimizes the divergence of the electron trajectories by constraining the electrons to move in tight spirals parallel to the magnetic field.

The electrode structure, including the source of the magnetic field, is enclosed in a vacuum chamber (not shown) attached to a suitable sublimation and ion-pumping system whose base pressure is in the low $10^{-10}$ Torr range.

In the experimental embodiment, a tungsten (114) crystal is used to provide an emitter having a well-known work function which could be maintained at a constant value through periodic cleaning by high-temperature flashing. (Voltage source 12 is used to provide the current required for heating the emitter and for the high temperature flashing). A target heater voltage supply 30 is coupled to the collector 14 to allow the semiconductor surface to be investigated at different temperatures or to flash off the semiconductor surface. The collector 14 is a semiconductor film epitaxially grown on a substrate of Iridium (IR (100)) but may also be in the form of a bulk semiconductor slab. The non-reducing IR substrate was chosen to avoid extraneous chemical interactions between the substrate and the semiconductive coating. The collector 14 was mounted on a swing arm (not shown) that enabled it to be moved from in front of the electron beam to a position over an evaporator station (also not shown) where films of semiconductor material could be deposited on the collector substrate.

Figure 2:
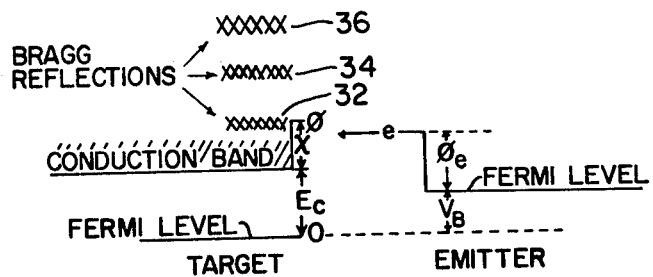
FIG. 2 is a simplified energy-level diagram of a semiconductor surface which is used as a target for incident low-energy electrons in the system of FIG. 1.

Referring now to FIG. 2, there is shown an energy-level diagram for a semiconductor target and an emitter for the experimental apparatus of FIG. 1. The left portion of FIG. 2 is an energy-level diagram of the band structure of a semiconductor surface in which the work function $\phi$ is shown as the sum of the conduction-band edge $E_c$ and the electron affinity $\chi$. $E_c$ is the position of the conduction band-edge measured with respect to the Fermi level and $\chi$ is the difference between the vacuum level (i.e., the work function $\phi$) and $E_c$. The portion of FIG. 2 on the right shows an energy-level diagram of an emitter whose vacuum level (work function $\phi_e$) is changed with respect to the semiconductor target by applying a voltage $V_B$ between the emitter and the target.

The kinematic model (i.e., the nearly-free-electron single scattering approximation) is the simplest approximation made for electron interactions with a lattice and is the one that gives rise to the familiar Bragg reflection conditions. According to the kinematic model, if the semiconductor is a single crystal of lattice spacing d perpendicular to the surface, unallowed energy states will exist in the conduction band where the Bragg condition $n\lambda = 2d$ exists (n being an integer and $\lambda$ being the DeBroglie wavelength of the incident electrons). If this condition can be expressed in terms of the free-electron kinetic energy, this results in the well-known relation for the energies of the Bragg reflections $$\epsilon = (h^2/2m)(\pi n/d)^2$$

where h, m and d are Planck's constant, the effective electron mass, and lattice spacing perpendicular to the surface, respectively. This may be simplified to $$\epsilon = (37/d^2)n^2 \qquad (1)$$

where $\epsilon$ is the kinetic energy of the electrons in eV and d is the lattice spacing Å. Since the kinetic energy of the electron inside the semiconductor is measured with respect to the bottom of the conduction band, it is seen that the position of the reflections is directly related to the position of $E_c$. Energies corresponding to Bragg reflections are shown by the cross-hatched regions 32, 34, and 36 in FIG. 2.

Figure 3:
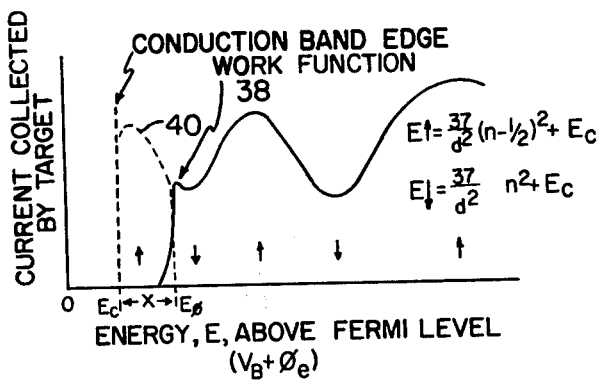
FIG. 3 is a typical LEER pattern of the current collected by the semiconductor in the retarding-to-accelerating region for incident low-energy electrons.

The electron reflections as given by equation (1) exist also for energies in the conduction band which are above the vacuum level (as illustrated at 34 and 36 in FIG. 2). Therefore, these reflections should correspond to minima in the current collected by the semiconductor for incident electron energies corresponding to the unallowed energy states. FIG. 3 shows the possible collected current which might be expected for a semiconductor having electronic surface characteristics as shown in FIG. 2, plotted as a function of the energy of $V_B + \phi_e$. This is the electron energy above the Fermi level of the semiconductor target. (It is noted that the emitter work function $\phi_e$ must always be monitored.) The minima ($\downarrow$) in the low-energy electron reflection (LEER) pattern correspond to the positions of the reflections given in equation (1) with the addition of the $E_c$ term since the energy is measured with respect to the Fermi level. Therefore $$E(\downarrow) = (37/d^2)n^2 + E_c, \; n = 1, 2, 3 \ldots \qquad (2)$$

and the abscissa of FIG. 3 is representative of the vertical energy scale of FIG. 2. Similarly maxima ($\uparrow$) of collected current exist at $$E(\uparrow) = (37/d^2)(n-\tfrac{1}{2})^2 + E_c, \; n = 1, 2, 3 \ldots \qquad (3)$$

Consequently, from equations (2) and (3), it is seen that for a given lattice spacing, the positions of the maxima and minima of the low-energy electron reflection patterns are determined only by the position of the bottom of the conduction band $E_c$. The point 38 where the electron current joins the deviations represents the energy at which the energy of electrons at the vacuum level of the emitter are equal to the energy of the electrons at the vacuum level of the target. Hence this value, $E_\phi$, represents the work function of the semiconductor.

The dashed line 40 indicates how the LEER pattern might continue if electrons were not stopped by the electron-affinity barrier. The zero-kinetic-energy point of the electrons $E_c$, can be obtained experimentally from the maxima or minima using equations (2) and (3) if the value of d is known. The value of d can also be determined from plots of maxima and minima using approximate values of d in equations (2) and (3) and making a "best fit" comparison with the experimentally observed values.

It should be noted that the above description of the LEER patterns is strictly an analysis of the first-order effects in that only the positions of the maxima and minima are discussed. Understanding the shapes of the curves depends on a more detailed knowledge of the band structure. There are also many other subtle second-order effects which have been observed but for which additional data and further analyses are required before complete interpretations can be made. Another factor to be considered is that even for the case where a kinematical approximation is not necessarily valid and the LEER pattern is much more complicated than the type given in FIG. 3, shifts in the pattern can be related to shifts in $\chi$ or $E_c$ when certain surface changes are made. This is, of course, provided that the pattern does not change in shape appreciably due to changes in band structure. However, in this case a determination of the absolute value of $\chi$ and $E_c$ will be more difficult and will depend on analyses similar to the more complex low-energy electron diffraction (LEED) intensity calculations.

AN EXAMPLE OF EXPERIMENTAL RESULTS

Figure 4:
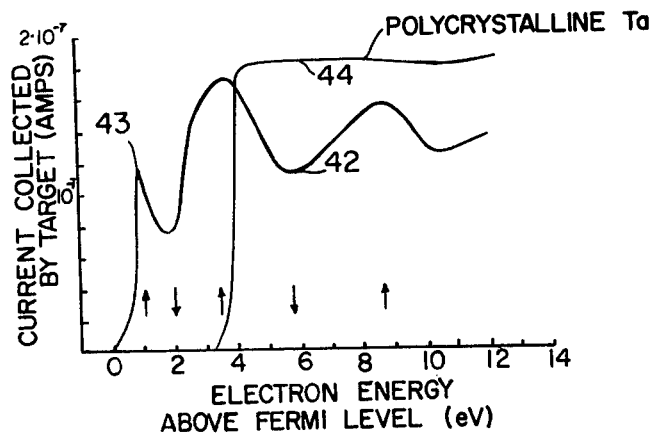
FIG. 4 is an experimentally obtained LEER pattern on an epitaxially-grown thin film of BaO.

A plot of the actual LEER pattern observed on an epitaxial film (50 Å) of BaO grown in Ir(100) is shown at 42 in FIG. 4. From the change in position of the various LEED spots with varying energy, it was determined that the lattice spacing was 5.46 Å for these films, a spacing which is within about 1% of the reported bulk value. The LEER maxima and minima for this lattice spacing as calculated from Eq. (2) and (3) are shown by the arrows just above the abscissa. The good agreement between the calculated and actual measured values is apparent. The value of the resulting work function $\phi$ = 1.3 (given by point 43), is also in agreement with typical values found in the literature. The electron affinity (from equations 2 and 3) for the film is $\sim 0.6$eV, a value which could never before be measured directly but agrees well with values previously suggested to correlate various optical data for this semiconductor. The upper curve 44 of FIG. 4 shows the standard retarding potential curve for this system if a polycrystalline Ta surface is used to replace the BaO film as the target. It is noted that the single-crystal LEER pattern is not found for the polycrystalline surface.

Figure 5:
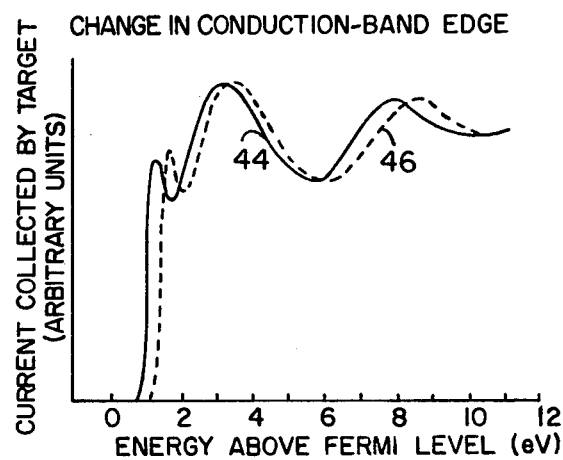
FIGS. 5, 6, and 7 are curves illustrating the effects of changes in electron affinity and the position of the conduction-band edge on LEER patterns.
Figure 6:
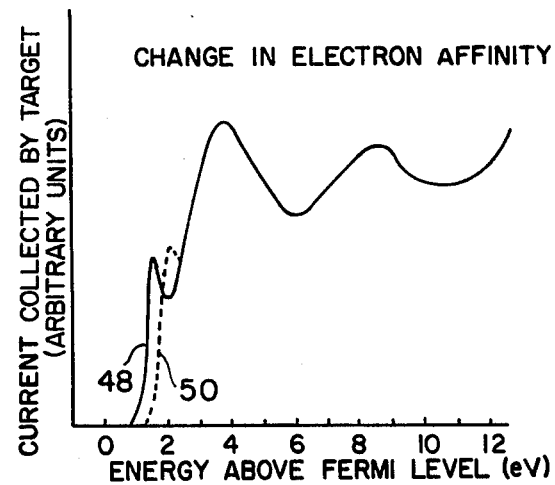
Figure 7:
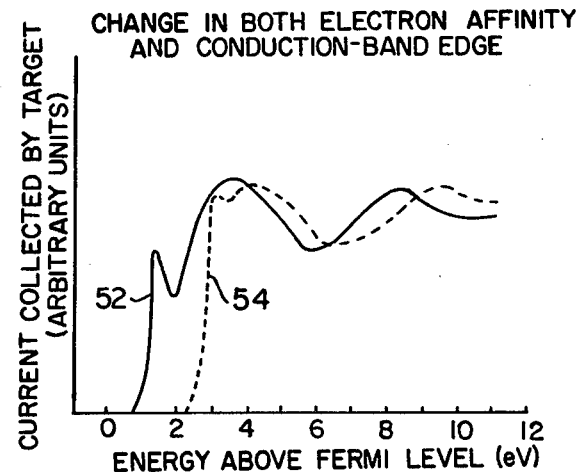

FIGS. 5, 6 and 7 illustrate how the LEER patterns may be affected by changes in the conduction-band edge or electron affinity, or both, respectively, in a semiconductor. In FIG. 5 the position of the conduction-band edge with respect to the Fermi level is affected by changing the sample temperature in a BaO film. In solid curve 44, T = 300° K., $\phi$ = 1.2eV, and $\chi \simeq 0.75$eV, whereas in dashed curve 46, T = 550° K., $\phi$ = 1.6eV, and $\chi \simeq 0.75$eV. In FIG. 6, the electron affinity is changed as the result of altering the surface stoichiometry of the sample. Solid curve 48 is for a sample having a barium-to-oxygen ratio of 0.54, $\phi$ = 1.5eV, and $\chi \simeq 0.5$eV, whereas dashed curve 50 is for barium-to-oxygen ratio of 0.48, $\phi$ = 2.0eV, and $\chi \simeq 1.0$eV. In FIG. 7, both $\chi$ and $E_c$ of the BaO film have been changed as shown by solid curve 52 where $\phi$ = 1.3eV and $\chi \simeq 0.6$eV and by dashed curve 54 where (after gas contamination) $\phi$ = 2.95eV and $\chi$ = 1.5eV.

Although the method of the present invention has been described with specific reference to determination of $E_c$ and $\chi$ in single crystalline BaO, it is apparent that the present invention is applicable to the analysis of the surface properties of single-crystal semiconductors in general.

Obviously, many modifications and variations of the present invention are possible in light of the above teachings. It is therefore to be understood that within the scope of the appended claims, the invention may be practiced otherwise than as described.

What is claimed and desired to be secured by Letters Patent of the United States is:

1. A method for determining the position of the conduction-band edge $E_c$ with respect to the Fermi level in a target area of the surface of a single-crystal semiconductor comprising the steps of:
    (a) directing a beam of low-energy electrons from an emitter onto said target area of the surface of said semiconductor;
    (b) varying the energy of said low-energy electrons from the Fermi level of said target area through an energy corresponding to the energy of at least one unallowed energy state in the conduction band of said target area, said unallowed energy state being above the vacuum level of said target area;
    (c) measuring the current collected by said semiconductor due to the incidence of said low-energy electrons on said target area;
    (d) correlating the electron energy above the Fermi level for said low-energy electrons with the current collected by said semiconductor; and
    (e) determining the energies $E\downarrow$ of said low-energy electrons which correspond to minima in the current collected by said semiconductor, said minima corresponding to unallowed energy states, said minima being related to said position of said conduction-band edge $E_c$ by the formula $$E\downarrow = (37/d^2)n^2 + E_c$$

where $E\downarrow$ and $E_c$ are in eV, d is the lattice spacing of said semiconductor crystal in Å, and n is an integer.

2. The method as recited in claim 1 further comprising the step of:
    (f) determining the energies $E\uparrow$ of said low energy electrons which correspond to maxima in the current collected by said semiconductor, the maxima being related to said position of the conduction-band edge $E_c$ by the formula $$E\uparrow = (37/d^2)(n/\tfrac{1}{2})^2 + E_c$$

3. The method of claim 1 further comprising a method for determining the electron affinity $\chi$ of said target area, said method comprising the step of:
    (f) determining the energy $E_\phi$ of said low-energy electrons which corresponds to the energy at which the vacuum level of the emitter is equal to the vacuum level of said target area, $E_\phi$ being related to $E_c$ and $\chi$ by $\chi = E_\phi - E_c$.

4. A method for determining the position of the conduction-band edge $E_c$ with the respect to the Fermi level in a target area of the surface of a single-crystal semiconductor comprising the steps of:

(a) directing a beam of low-energy electrons from an emitter onto said target area of the surface of said semiconductor;

(b) varying the energy of said low-energy electrons from the Fermi level of said target area through an energy corresponding to the energy of at least one unallowed energy state in the conduction band of said target area, said unallowed energy state being above the vacuum level of said target area;

(c) measuring the current collected by said semiconductor due to the incidence of said low-energy electrons on said target area;

(d) correlating the electron energy above the Fermi level for said low-energy electrons with the current collected by said semiconductor; and (e) determining the energies $E\uparrow$ of said low energy electrons which correspond to maxima in the current collected by said semiconductor, the maxima being related to said position of the conduction-band edge $E_c$ by the formula $$E\uparrow = (37/d^2)(n-\tfrac{1}{2})^2 + E_c$$

where $E\uparrow$ and $E_c$ are in eV, d is the lattice spacing of said semiconductor crystal in Å, and n is an integer.